United States Patent
Kizer et al.

(10) Patent No.: US 7,519,844 B2
(45) Date of Patent: Apr. 14, 2009

(54) PVT DRIFT COMPENSATION

(75) Inventors: Jade Kizer, Durham, NC (US); Sivakumar Doriswamy, San Jose, CA (US)

(73) Assignee: Rambus, Inc., Los Altos, CA (US)

( * ) Notice: Subject to any disclaimer, the term of this patent is extended or adjusted under 35 U.S.C. 154(b) by 366 days.

(21) Appl. No.: 11/158,753

(22) Filed: Jun. 22, 2005

(65) Prior Publication Data
US 2006/0294410 A1 Dec. 28, 2006

(51) Int. Cl.
*G06F 1/12* (2006.01)
*G06F 1/00* (2006.01)
*G06F 1/04* (2006.01)

(52) U.S. Cl. .............. 713/400; 713/401; 713/500; 713/503

(58) Field of Classification Search ............... 711/154; 713/400
See application file for complete search history.

(56) References Cited

U.S. PATENT DOCUMENTS

| 6,806,750 B1 * | 10/2004 | Rasmussen et al. ......... 327/156 |
| 6,839,301 B2 * | 1/2005 | Lin et al. .................... 365/233 |
| 7,088,158 B2 * | 8/2006 | Block et al. ................. 327/158 |
| 2003/0065962 A1 * | 4/2003 | Lim et al. .................... 713/401 |

* cited by examiner

*Primary Examiner*—Thomas Lee
*Assistant Examiner*—Stefan Stoynov
(74) *Attorney, Agent, or Firm*—Lerner, David, Littenberg, Krumholz & Mentlik, LLP

(57) ABSTRACT

A timing circuit for generating a timing signal having a predetermined relationship with a reference signal. The timing circuit includes a locked loop for generating the recovered clock signal, comparing the phase of the reference signal to the phase of the timing signal, and adjusting the phase of the timing signal based on the comparison; and a PVT (Process-Voltage-Temperature) line operatively associated with the locked loop so that PVT drift in the PVT line counters PVT drift in the locked loop.

31 Claims, 7 Drawing Sheets

PVT DRIFT COMPENSATION

BACKGROUND

Digital devices as, for example, circuits within a computer, send information to one another by varying a parameter of a signal as, for example, an electrical voltage, during successive intervals set by a clock in the sending device. In a binary system, the sending device sets the signal parameter for each interval either to a first value to denote a 1 or a second value to denote a 0 during each interval. The receiving device takes successive samples of the signal at times corresponding to the intervals in the signal and determines, for each such sample, whether the parameter denotes a "0" or a "1." To do this, the receiving device must have a clock signal synchronized with the intervals in the incoming data signal. If the clock used by the receiving device is out of synchronization with the intervals of the data signal, data can be lost or misinterpreted. To communicate data at high speed, it is desirable to make the bit intervals as short as possible, which, in turn, requires greater precision in the synchronization between the clock signal used by the receiving device and the data intervals of the incoming signal. For example, modern interfacing and communication protocols such as PCI Express, SONET, Infini-Band and XAUI use data intervals on the order of nanoseconds or less and require that the receiving device use a clock which is synchronized to the data intervals to within fractions of a nanosecond.

BRIEF DESCRIPTIONS OF THE DRAWINGS

The following detailed description given by way of example, but not intended to limit the invention solely to the specific embodiments described, may best be understood in conjunction with the accompanying drawings wherein like reference numerals denote like elements and parts, in which.

DETAILED DESCRIPTION

Figure 1:
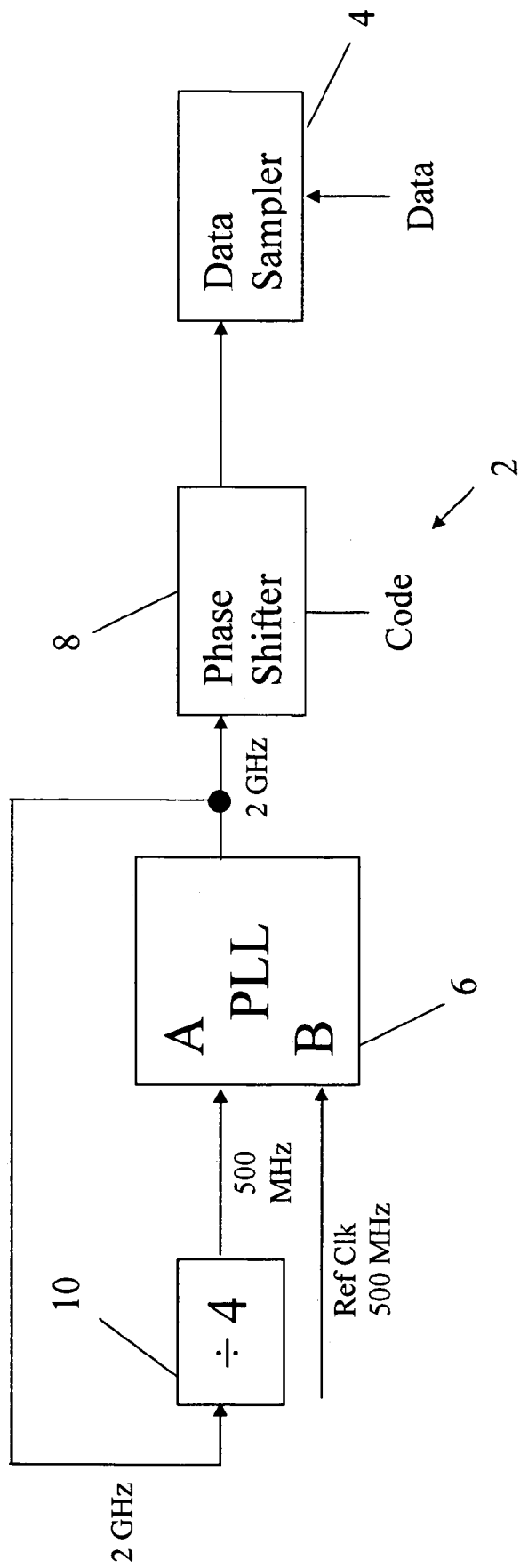
FIG. 1 is a functional block diagram of a clock recovery circuit and associated data sampler.

Referring now to FIG. 1, there is shown a timing circuit in the form of a clock recovery circuit 2 and associated data sampler 4. The circuit is used to receive a 500 MHz reference clock signal and convert the received signal to a 2 GHz signal that is phase locked to the 500 MHz signal. Such a circuit is used, by way of illustration, at a receiver to recover a 2 GHz clock signal that has been down-converted to 500 MHz by a transmitter and sent to the receiver together with data which requires the 2 GHz clock for sampling.

The circuit includes a Phase Locked Loop (PLL) 6 having input terminals A and B, a phase shifter 8 and a divider 10. The PLL includes a phase detector and a voltage controlled oscillator (VCO). The phase detector compares the phase of the divider output (appearing at input A) with the phase of the reference clock (appearing at input B), generates a difference signal proportional to the phase difference, and uses the difference signal to control its VCO. Thus, if the divider output and the reference clock fall out of phase, the phase detector generates a signal proportional to the phase difference and the signal is used to increase or decrease the output frequency of the oscillator. Since the oscillator output is fed back to the divider input, any change in oscillator output is reflected back through the divider for comparison to the reference clock. In this manner, the oscillator will change its output frequency until the phase of the output, as reflected through the divider, is equal to the phase of the reference clock.

However, in the FIG. 1 system the delay associated with the feedback loop that extends from the PLL output (VCO output) to PLL input A is a source of phase error. Such error is readily apparent if one considers an initial state in which a reference clock of predetermined phase is input to the PLL and the PLL output matches the reference clock in both phase and frequency. In this state, the output of the PLL that is fed back to PLL input A will appear at input A having a phase equal to the phase of the PLL output plus a phase error imparted by the delay of the feedback loop. Thus, the phase at input A will lag the phase at input B and the output phase of the PLL will be advanced until the phase at input A matches the phase at input B. The system will stabilize when the phase at the PLL output is advanced relative to the phase of the reference clock. In this stable state, the frequency at the PLL output is matched to the frequency of the reference clock input. Accordingly, the delay of the feedback loop gives rise to phase error in the PLL output.

It should be noted that FIG. 1 is provided merely to illustrate the delay associated with the PLL feedback loop. The feedback loop will have an associated delay regardless of whether or not it includes an active element such as divider 10, and regardless of how many elements it includes. For example, if the PLL was being used merely to generate a "clean" 500 MHz clock based on a "noisy" received 500 MHz clock, there would be no divider in the FIG. 1 circuit; nevertheless, there would be a delay associated with the path feeding back the VCO output to input A.

In any event, the error introduced by the delay of the feedback loop is removed by the phase shifter 8. The phase shifter receives the PLL output and phase shifts it by an amount that compensates for the error introduced by the delay of the feedback loop. The phase shifter corrects for the phase error PLL output by applying a countering phase shift to the PLL output prior to passing that output, the "recovered clock," to the data sampler. Ideally, the phase shift applied by the phase shifter is equal and opposite to the phase error.

In a preferred embodiment, the phase shifter is a digital phase interpolation device wherein the amount of phase shift applied by the phase shifter is controlled through a digital control value. In such embodiment, the VCO of PLL 6 outputs a multiplicity of signals, including a main signal and one or more additional signals. The additional signals are phase shifted relative to the main signal by respective amounts. The phase shifter mixes the main signal with the additional signals to generate an output signal that is a phase shifted version of the main signal. The contribution of each of the VCO output signals to the phase shifter output signal is determined by the digital code. An advantage of the digital phase interpolator embodiment is that it provides a phase shift range of 360 degrees.

The digital phase interpolator embodiment could be implemented using a VCO that outputs only a main signal. In such implementation, the phase shifter includes a multiplicity of delay element strings of varying lengths to generate the phase-shifted versions of the main signal. The phase-shifted versions are then mixed with the main signal to generate an output signal that is phase-shifted to compensate for the phase error.

In another preferred embodiment, the phase shifter does not use phase interpolation. Rather, the phase shifter simply receives a VCO output signal and delays that signal by an amount that corresponds to a phase shift which counters the phase error. In one implementation, the phase shifter includes a multiplicity of delay element strings of varying lengths and the phase shifter merely couples the VCO output to the string that corresponds to the desired phase correction. String selection may be made in response to a digital command.

In any case, in order to determine the amount of phase shift that must be applied by the phase shifter, a calibration procedure is executed. In the calibration procedure, known clock and data signals are input to the FIG. 1 system and the digital code sent to the phase shifter is adjusted until the data sampler correctly samples the data; thereby indicating that the phase of the phase shifter output (the adjusted PLL output) correctly matches the phase of the reference clock. In this manner, a correction is applied for the delay associated with the feedback loop.

However, a further source of error remains. The delay associated with the feedback loop is subject to change. In particular, the delay changes with respect to the process by which the FIG. 1 structure is fabricated, with respect to the voltage at which the structure is being operated, and with respect to the temperature conditions under which the structure is operating. Collectively, the change in delay that results from changing process, voltage and/or temperature conditions is referred to as "PVT drift." It is also referred to as "second order delay." PVT drift correction is initially discussed in FIG. 2.

Figure 2:
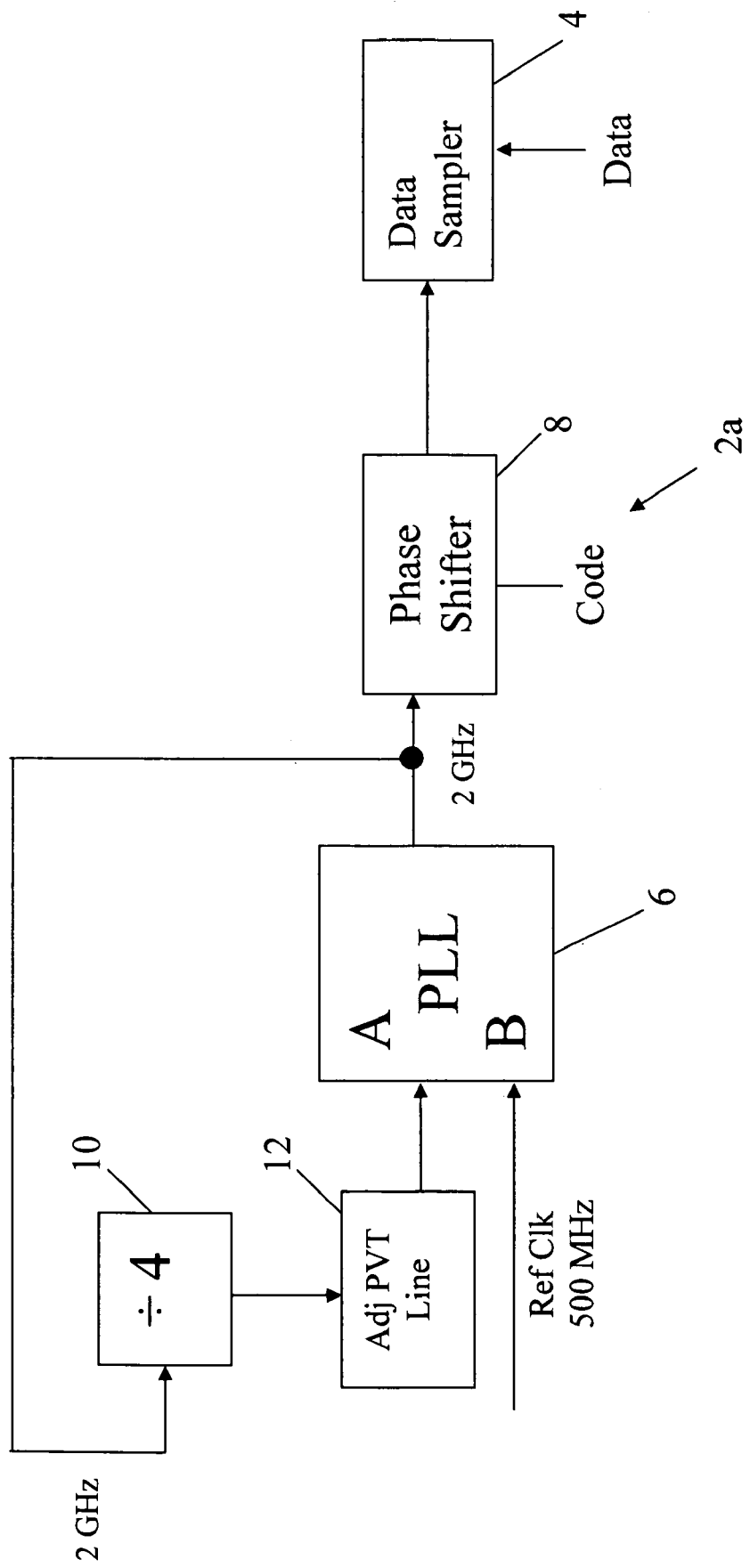
FIG. 2 is a functional block diagram of a clock recovery circuit and associated data sampler wherein the clock recovery circuit incorporates Process-Voltage-Temperature (PVT) drift compensation.

FIG. 2 shows a timing circuit in the form of a clock recovery circuit 2a and associated data sampler 4. Clock recovery circuit 2a differs from clock recovery circuit 2 in that it includes a PVT drift compensation element 12. Ideally, the PVT drift compensation element is an element having drift properties that counteract the drift that occurs in the feedback loop. For example, if a given temperature change causes the delay associated with the feedback loop, apart from element 12, to increase by an amount "x," then the delay associated with element 12 would ideally decrease by an amount "x" for the same temperature change. Thus, the net change in loop delay, for the given temperature change, would be zero. Further, as long as the PVT drift of element 12 tracks the PVT drift associated with the feedback loop, the system will experience no phase error due to PVT drift. Element 12 could be moved to any location in the FIG. 2 circuit, for example between the PLL output and the divider, between the PLL output and the phase shifter, at the output of the phase shifter, or on the reference clock line. Regardless of element 12's location, its effect will remain the same.

Figure 3:
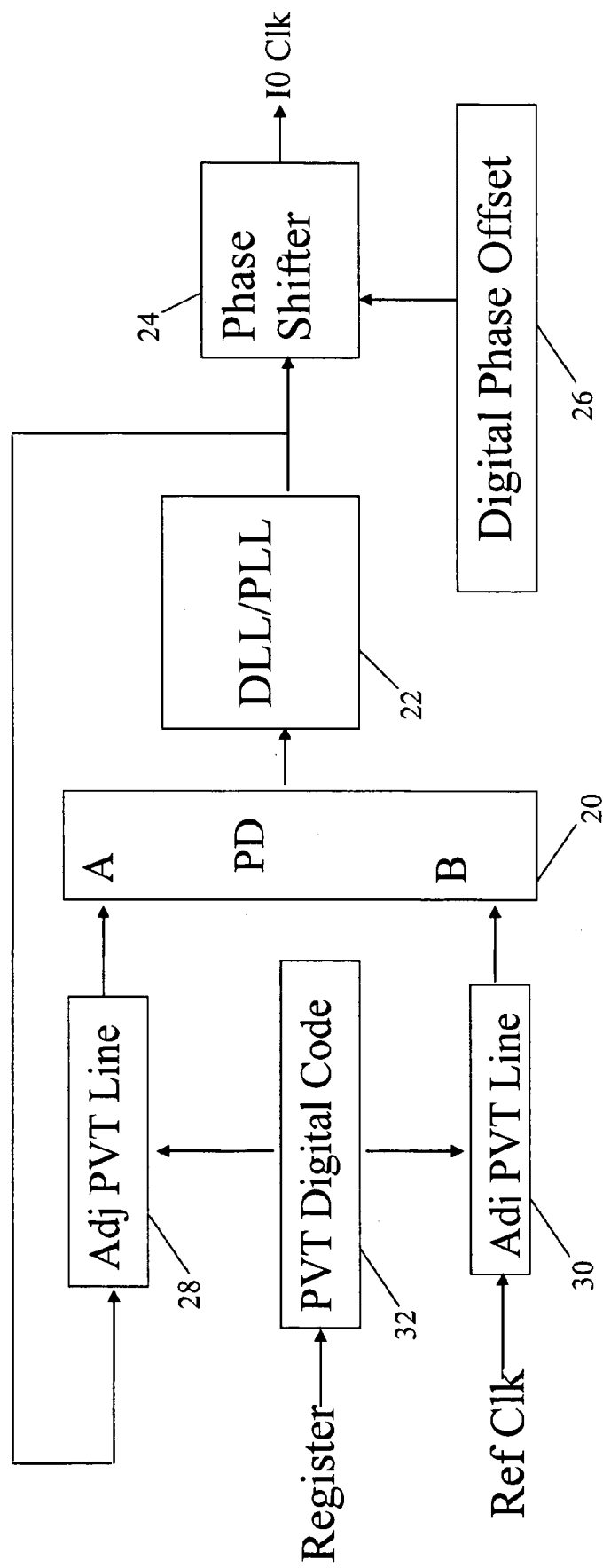
FIG. 3 is functional block diagram of a clock recovery circuit incorporating digitally controlled PVT drift compensation.

A timing circuit in the form of a clock recovery circuit incorporating PVT drift compensation according to an alternative embodiment of the invention is shown in FIG. 3. The circuit of FIG. 3 could be used, for example, by a receiver to generate a recovered clock signal (IO Clk) based on a clock signal received from a transmitter (Ref Clk). Typically, the signal-to-noise ratio of the transmitted clock signal deteriorates during transmission and the recovery circuit is used to provide a "clean" version of the received clock signal. Of course, the clean version of the received clock signal, IO Clk, must be in phase with the received clock signal, Ref Clk, so that data synched to the Ref Clk can be properly read using the IO Clk.

The circuit of FIG. 3 includes a phase detector 20 and a Delay Locked Loop/Phase Locked Loop (DLL/PLL) element 22. The phase detector compares the phase of a signal appearing at its "A" input with the phase of a signal appearing at its "B" input to determine a phase difference and outputs a signal having a magnitude proportional to the phase difference. The DLL/PLL adjusts its output, which is fed back to input A, so as to drive the output of the phase detector to zero. That is, the DLL/PLL adjusts its output until the phase of the signal appearing at input A is equal to the phase of the signal appearing at input B.

In one embodiment, the DLL/PLL includes a loop filter and a VCO—in which case it is a PLL. In such embodiment, a phase difference between the A and B signals results in an increase or decrease in the frequency of the VCO output. When the phase of the VCO output is such that the phase at A equals the phase at B, the VCO frequency will stabilize and the A and B signals will track each other in both phase and frequency.

In an alternative embodiment, the DLL/PLL includes a loop filter and a delay line—in which case it is a DLL. In such embodiment, a signal from a separate source (not shown) such as a separate VCO is passed to the delay line. The output of the phase detector is used to vary the delay applied by the delay line, and thus either advance or retard the output of the DLL/PLL. In this manner, the output of the DLL/PLL is shifted until the phase of the signal appearing at input B matches the phase of the signal appearing at input A.

In order to compensate for the fixed delay associated with the feedback loop from the output of the DLL/PLL to the input of the phase detector, a phase shifter 24 is provided. The phase shifter is preferably a digital controlled device that adjusts the phase of the DLL/PLL output according to a digital phase offset 26. The output of the phase shifter is a timing signal in the form of the recovered clock signal, IO Clk.

The FIG. 3 circuit also includes a first adjustable PVT line 28 and a second adjustable PVT line 30. The first and second adjustable PVT lines are digitally controlled devices that are adjusted according to a PVT digital code 32. Delay applied by PVT line 30 tends to retard the output signal (IO Clk) relative to the input signal (Ref Clk), whereas delay in the feedback path (including PVT line 28) has the opposite effect. The adjustable PVT lines are selected so as to minimize the difference between (i) the PVT drift of the feedback path from the DLL/PLL output to input A of the phase detector, and (ii) the PVT drift of the path from the input of adjustable PVT line 30 to input B of the phase detector. To achieve a matched drift characteristic for the two paths, the combined drift of the adjustable PVT lines must act to compensate for the relative drift of the two paths apart from the PVT lines. In practice, the PVT digital code that minimizes drift error is predetermined according to a calibration procedure, and is passed from a storage register to the adjustable PVT lines. Each of the adjustable PVT lines includes logic circuitry that determines the line's setting in accordance with the received code.

Figure 4:
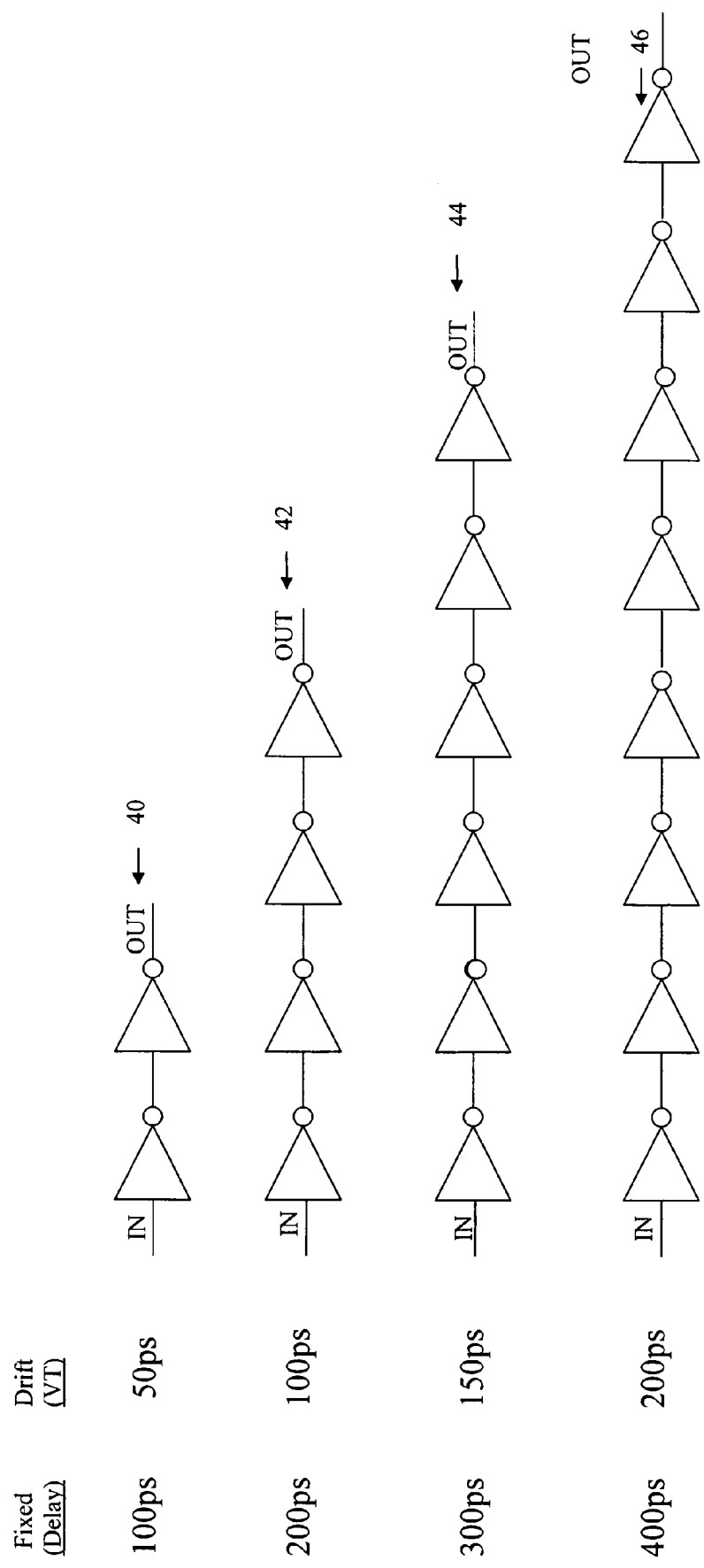
FIG. 4 is a diagram showing various states of an adjustable delay line and the fixed delay and Voltage-Temperature (VT) drift delay associated with each state.

FIG. 4 is a diagram representing one possible implementation of an adjustable PVT line. The figure shows inverter chains 40, 42, 44 and 46 having various lengths. Each inverter chain has respective input and output terminals which are labeled "IN" and "OUT." The drift imparted by the PVT line is adjusted by selecting the appropriate inverter chain to couple the adjustable PVT line input to the adjustable PVT line output. For example, if a drift characteristic of 50 picoseconds (ps) is desired, the two-inverter chain 40 is selected to couple the input of the adjustable PVT line to the output of the adjustable PVT line. If a drift characteristic of 100 ps is desired, the four-inverter chain 42 is selected. The selective coupling of the inverter chains is accomplished through electronic switching. Since each chain has an even number of inverters, digital values input to the adjustable PVT line are inverted an even number of times regardless of which inverter chain is selected and thus the digital values are preserved at the output of the adjustable PVT line.

Notably, each chain of inverters has an associated fixed delay. As such, the adjustable PVT line contributes a fixed delay to the path in which it is inserted. The amount of fixed delay added by the line is determined by the selected inverter chain. For example, the two-inverter chain 40 contributes a fixed delay of 100 ps, and the four-inverter chain contributes a fixed delay of 200 ps. The fixed delay associated with a selected inverter chain would serve as an additional source of phase error if it were not addressed. However, the fixed delay contributed by a selected inverter chain is addressed through a downstream phase adjustment. In a preferred embodiment, the fixed delay of a selected inverter chain is removed by a downstream phase shifter, for example, phase shifter 8 of FIG. 2 or phase shifter 24 of FIG. 3.

Regarding the use of adjustable PVT lines throughout this description, it should be noted that a non-adjustable PVT line may be substituted for any of the adjustable PVT lines discussed herein. Of course, wherever a non-adjustable PVT line is used the drift compensation provided by such PVT line can not be adjusted for varying operating conditions, and thus a non-adjustable line is best used when the conditions under which it will operate are known and fixed.

Referring back to FIG. 3, the digital phase offset 26 is adjusted to compensate for any net fixed delay contributed by adjustable PVT lines 28 and 30. For instance, in order to minimize drift error, adjustable PVT line 28 may be switched to a four-inverter setting while adjustable PVT line 30 is switched to a two-inverter setting. In such case, the net fixed delay contributed by the adjustable PVT lines is 200 ps (four inverters of line 28) minus 100 ps (two inverters of line 30), or 100 ps. The digital phase offset 26, which has already been set to remove fixed delay apart from that contributed by the adjustable PVT lines, is then adjusted to account for the fixed delay added by the PVT lines. So, if the digital phase offset necessary to account for the fixed delay apart from that contributed by the adjustable PVT lines is "x," and the digital phase offset necessary to account for the net fixed delay contributed by the PVT lines is "y," the digital phase offset applied to phase shifter 24 is x+y.

It should be understood that "removal" of the fixed delay associated with one or more adjustable PVT lines refers to cases in which the exact amount of fixed delay is removed and to cases in which an in-exact amount of the fixed delay is removed.

Having described the operation of the FIG. 3 embodiment, it is important to note that in a one-adjustable-PVT-line embodiment, either of line 28 or line 30 could be removed and the remaining line could be adjusted to minimize drift error. Nevertheless, the embodiment employing two adjustable PVT lines is preferable because it allows for bi-directional PVT drift compensation. To illustrate, a case in which both line 28 and line 30 of FIG. 3 are of the type shown in FIG. 4 is considered. In this case, if line 28 is on the four-inverter setting while line 30 is on the two-inverter setting, the lines will apply net 50 ps drift delay to the feedback loop (100 ps of contributed by line 28—50 ps contributed by line 30). In the same case, if line 30 is on the four-inverter setting while line 28 is on the two-inverter setting, the lines will apply net −50 ps drift delay to the feedback loop (50 ps contributed by line 28—100 ps contributed by line 30). Thus, the embodiment featuring two adjustable PVT lines allows for a wider range of drift compensation by adding a second adjustable PVT line of the same type.

Figure 5:
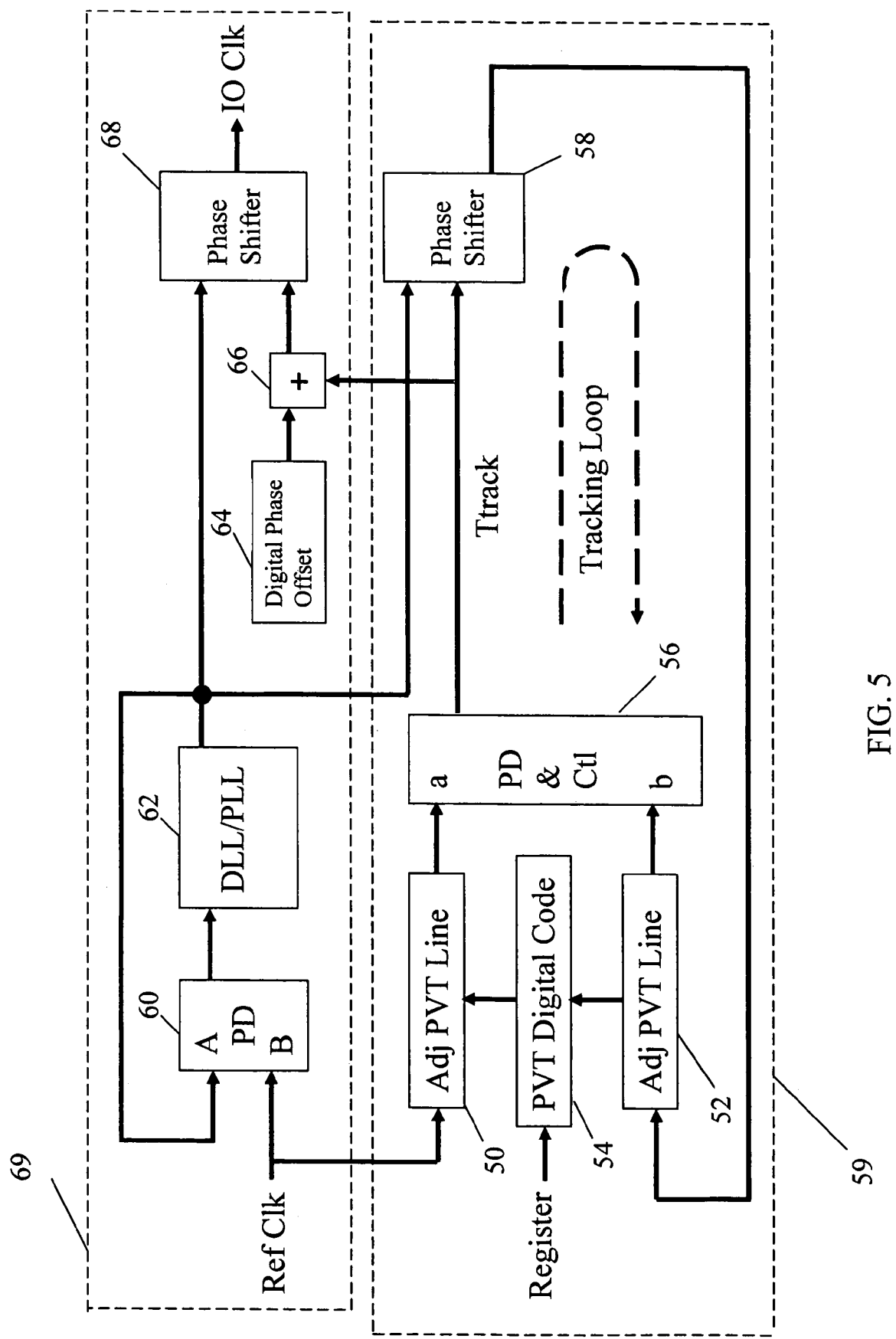
FIG. 5 is a functional block diagram of a dual loop embodiment for implementing digitally controlled PVT drift compensation.

Referring now to FIG. 5, there is shown a dual loop embodiment for implementing digitally controlled PVT drift compensation. The FIG. 5 embodiment employs two adjustable PVT lines 50 and 52, although it could also be implemented using only one adjustable PVT line. The two adjustable PVT lines are controlled by a PVT digital code 54. In a preferred embodiment, the adjustable PVT lines are of the type depicted in FIG. 4. The outputs of the adjustable PVT lines are coupled to a phase detection and control circuit (PD & Ctl) 56, the output of line 50 being coupled to input "a" of the PD & Ctl circuit and the output of line 52 being coupled to input "b" of the PD & Ctl circuit. The output of the PD & Ctl circuit is coupled to a phase shifter 58. Together, the adjustable PVT lines, PD & Ctl circuit, PVT digital code and phase shifter 58 make up a tracking loop 59.

The purpose of the tracking loop is to determine a digital code "Ttrack" that represents the net fixed delay and drift delay associated with adjustable PVT lines 50 and 52. The digital code "Ttrack" is then used to apply a PVT drift adjustment to a timing loop.

In FIG. 5, a timing loop in the form of a clock recovery loop 69 to which Ttrack is applied includes a phase detector 60, a DLL/PLL element 62, a digital phase offset 64, an adder 66 and a phase shifter 68. The phase detector 60, DLL/PLL element 62, digital phase offset 64 and phase shifter 68 function the same way as the corresponding elements of FIG. 3. The clock recovery loop and tracking loop work together to generate a timing signal in the form of a recovered clock "IO Clk" based on an input clock "Ref Clk."

As in the FIG. 3 embodiment, the PVT digital code used in the FIG. 5 embodiment is the code that minimizes drift error in the IO Clk. The code is predetermined according to a calibration procedure, and is passed from a storage register to the adjustable PVT lines. Each of the adjustable PVT lines includes logic circuitry that determines the line's setting in accordance with the received code.

However, in the FIG. 5 embodiment, the compensatory delay provided by the adjustable PVT lines is not realized by including the lines in the PD-DLL/PLL loop. Rather, the compensatory delay provided by the adjustable PVT lines is computed by the PD & Ctl circuit and then applied by phase shifter 68.

More specifically, in the FIG. 5 embodiment, a predetermined PVT digital code is passed to the adjustable PVT lines which then apply some net fixed delay and drift delay to the Ref Clk relative to the output of DLL/PLL 62. Since the settings of the adjustable PVT lines are known (e.g. through the PVT digital code), the fixed delay attributable to the PVT lines is known (e.g. through comparison of inverter chain lengths). This fixed component can then be compensated for by phase shifter 58. More particularly, phase shifter 58 phase shifts the output of DLL/PLL 62 by an amount that compensates for the fixed delay attributable to the PVT lines. In a preferred embodiment, phase shifter 58 is a digital phase interpolator which phase shifts the output of the DLL/PLL according to a digital code included in Ttrack.

Consequently, the phase detector of the PD & Ctl circuit will generate a phase difference signal proportional to the net drift delay imparted by the PVT lines.

Accordingly, the PD & Ctl circuit measures the net drift delay and then uses the measurement along with a priori knowledge of the net fixed delay to generate Ttrack such that both the net fixed delay and net drift delay are included in Ttrack. For example, Ttrack is a two byte digital word with the first byte indicating the net fixed delay and the second byte indicating the net drift delay. In this manner, phase shifter 58 can determine the net fixed delay from Ttrack and shift the DLL/PLL output to account for such delay, and adder 66 can determine from Ttrack the net drift delay which is to be used to eliminate PVT drift error from the IO Clk.

The net drift delay imparted by lines 50 and 52, and reflected in Ttrack, is digitally added to digital phase offset 64 by adder 66. Since the digital phase offset 64 is used to compensate for the fixed delay associated with the clock recovery loop, the net phase offset output from adder 66 is an offset that compensates for fixed error and drift error in the clock recovery loop. The output of adder 66 is used by phase shifter 68, preferably a digital phase interpolator, to shift the phase of the output of DLL/PLL 62 to generate an IO Clk that is phase matched with Ref Clk.

The FIG. 5 configuration can be used to efficiently apply PVT drift compensation to numerous timing or clock recovery loops. For example, a single tracking loop 59 as shown in FIG. 5 can be used to provide PVT drift compensation for multiple clock recovery loops, each such clock recovery loop being configured like clock recovery loop 69 of FIG. 5. One way to use a single tracking loop with multiple clock recovery loops is through time multiplexing.

In a time multiplexing embodiment, a multiplicity of timing loops in the form of clock recovery loops are assigned respective time slots. Each clock recovery loop is then coupled to the tracking loop during its assigned time slot and decoupled from the tracking loop during the other time slots. For the period during which a given clock recovery loop is coupled to the tracking loop, the tracking loop serves to provide PVT drift compensation for the clock recovery loop. In order to implement a time multiplexing system using multiple clock recovery loops like the clock recovery loop shown in FIG. 5, and a single tracking loop like the tracking loop shown in FIG. 5, electronic switching is used.

Figure 6:
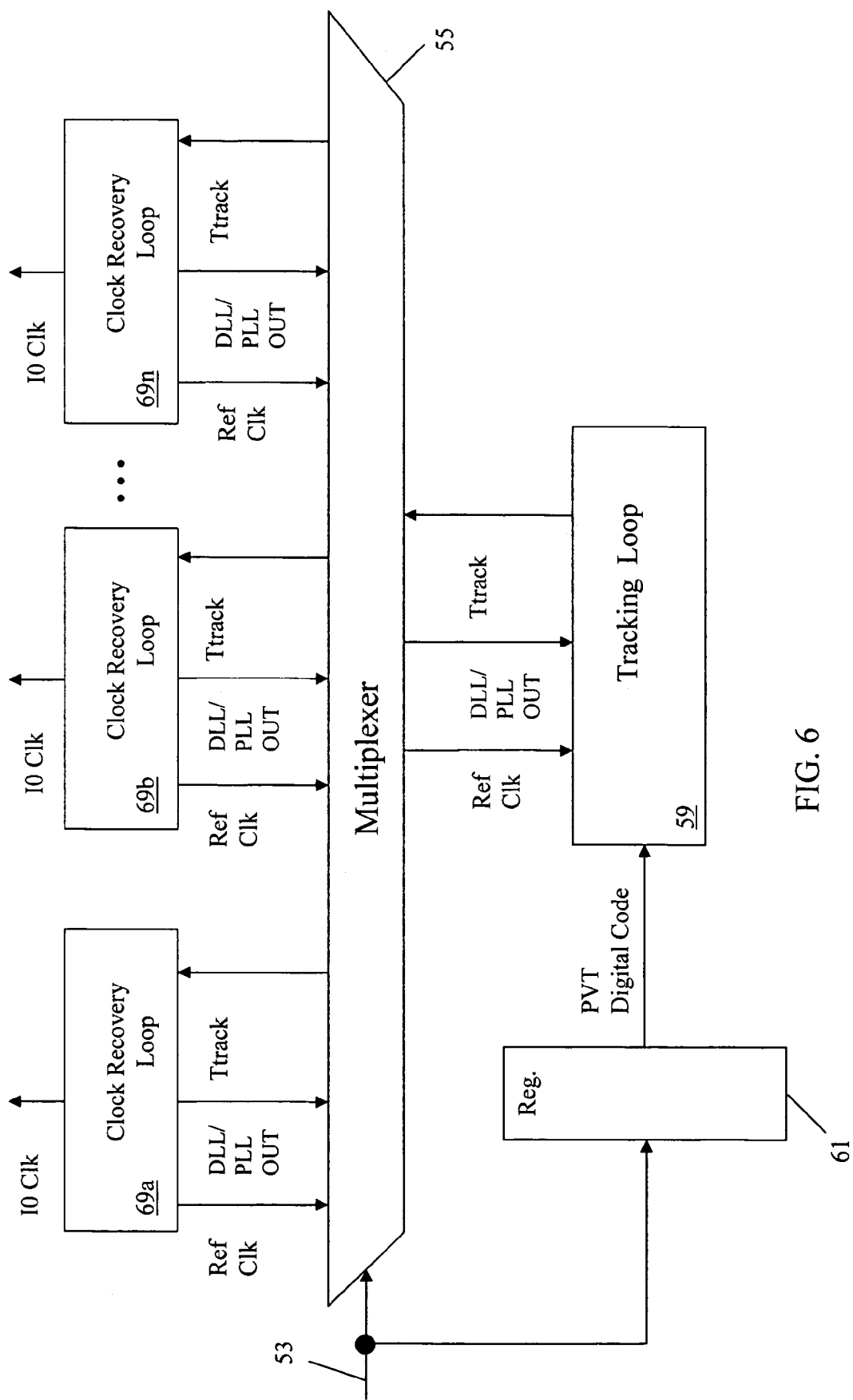
FIG. 6 is a block diagram of a time multiplexed system wherein a single tracking loop provides PVT drift compensation for a multiplicity of clock recovery loops.

FIG. 6 is a block diagram of a time multiplexed system in which a single tracking loop like loop 59 of FIG. 5 provides PVT drift compensation for a multiplicity of clock recovery loops 69*a*, 69*b* . . . 69*n*, each of the clock recovery loops being configured like clock recovery loop 69 of FIG. 5. As can be seen from FIG. 6, a multiplexer 55 selectively couples one of the clock recovery loops 69*a*-69*n* to the tracking loop 59 in response to a control signal 53. The control signal is also provided to a register 61 which has a multiplicity of predetermined PVT digital codes stored therein, the PVT digital codes respectively corresponding to clock recovery loops 69*a*-69*n*.

For a selected clock recovery loop, the corresponding predetermined PVT digital code is passed to the tracking loop and applied to the adjustable PVT lines of the tracking loop, as shown in FIG. 5. Also as shown in FIGS. 5 and 6, the reference clock associated with the selected clock recovery loop is coupled to adjustable PVT line 50, the DLL/PLL output of the selected clock recovery loop is coupled to phase shifter 58, and Ttrack is coupled to the adder of the selected clock recovery loop. Of course, all clock recovery loops but the clock recovery loop under examination are decoupled from the tracking loop.

One advantage of a time multiplexing implementation is the substitution of one set of tracking loop components for the multiple sets of tracking loop components that would be necessary if a dedicated tracking loop was provided for each clock recovery loop. This reduces the amount of physical space necessary to implement PVT drift compensation for multiple clock recovery loops and, in turn, reduces the cost of such drift compensation.

Figure 7:
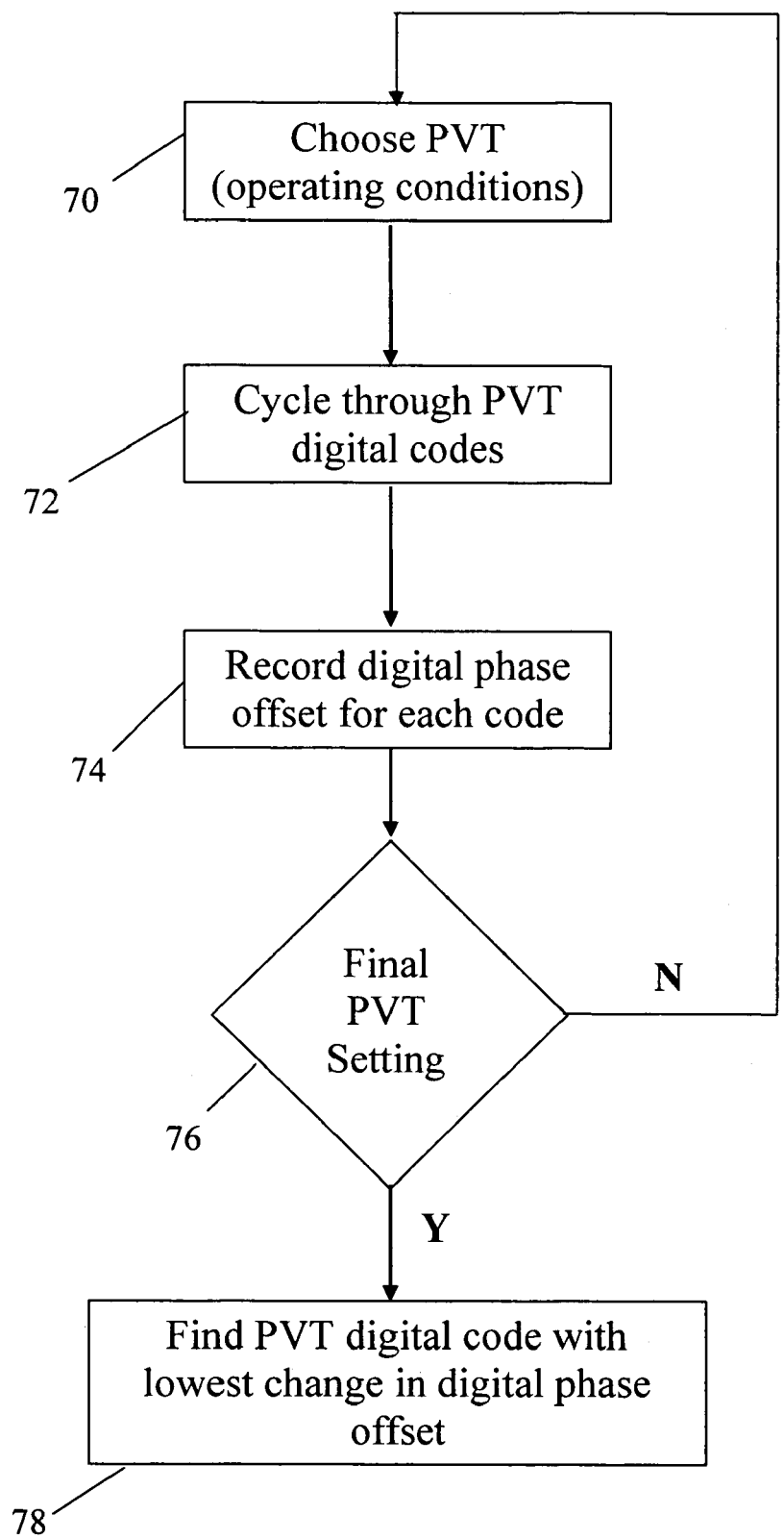
FIG. 7 is a flow chart describing a process for determining PVT digital codes for use in the FIGS. 3 and 5 embodiments.

Referring now to FIG. 7, there is shown a flowchart describing a process for finding PVT digital codes suitable for use in the FIGS. 3, 5 and 6 configurations. For clarity of presentation, the flow chart will be described in the context of the FIG. 3 embodiment.

As can be seen from FIG. 7, the process of finding a digital code begins by choosing a set of PVT operating conditions (step 70). Preferably, the operating conditions initially selected at step 70 are at one of the extremes for a process in which the timing circuit will be used. For example, the initial PVT selected is a High Temperature—Low Voltage environment for a given process (HT-LV).

After choosing the initial PVT conditions, the PVT digital code is cycled through all possible values (step 72). For each PVT digital code, the digital phase offset 26 required to minimize the phase difference between Ref Clk and IO Clk is recorded (step 74). For instance, if the PVT digital code is a 3 bit code, there are eight possible code values and thus eight digital phase offsets are recorded for the initial PVT setting.

After recording the digital phase offsets associated with each PVT digital code for the initial PVT setting, a determination is made as to whether or not the final PVT conditions have been selected (step 76). If the final PVT conditions have not been selected, the process returns to step 70 and the PVT setting is changed. Preferably, the PVT setting is changed once, from its initial extreme to an extreme opposing the initial extreme. Thus, if the initial setting is HT-LV, the second setting is a Low Temperature—High Voltage setting for the given process (LT-HV). Steps 72 and 74 are then executed for the new PVT setting.

Once the final PVT setting has been selected and digital phase offsets have been recorded for each PVT code under the final PVT setting, the process moves to a comparison step (step 78). At step 78 the recorded phase offsets for each PVT setting are compared. The PVT code that results in the minimal change in phase offset as PVT conditions move from one extreme to another, is the PVT code selected for the timing or clock recovery loop. That is, in the case where the clock recovery circuit of FIG. 3 is tested under two PVT settings, HT-LV and LT-HV, the PVT code selected for the circuit is the PVT code that results in the minimum change in digital phase offset as the circuit moves from HT-LV to LT-HV. The selected PVT code will then be used when the FIG. 3 circuit is performing its clock recovery function.

It should be noted that the PVT code selection process may involve more than two PVT settings. Indeed, any number of Process-Voltage-Temperature combinations could be analyzed before selecting a PVT code for a given clock recovery circuit.

It should be further noted that the PVT code selection process could be performed at anytime when the clock recovery loop for which the PVT code is needed is not in operation. Although, as a practical matter the PVT code selection process is performed when the clock recovery loop operating conditions can be easily controlled. For example, the PVT code selection process could be performed once for every semiconductor wafer having circuitry which includes one or more clock recovery loops that make use of the present drift compensation scheme, once for every integrated chip employing the scheme, once for every circuit employing the scheme within a given chip, or once for every circuit design that includes one or more chips that employ the scheme.

As these and other variations and combinations of the features discussed above can be utilized without departing from the present invention as defined by the claims, the foregoing description of the preferred embodiments should be taken by way of illustration rather than by way of limitation of the invention as defined by the claims.

The invention claimed is:

1. A timing circuit for generating a timing signal having a predetermined relationship with a reference signal, comprising:
   a locked loop for generating the timing signal, comparing the phase of the reference signal to the phase of the timing signal, and adjusting the phase of the timing signal based on such comparison; and
   a PVT (Process-Voltage-Temperature) line operatively associated with the locked loop so that PVT drift in the PVT line counters PVT drift in the locked loop.

2. The timing circuit as claimed in claim 1, wherein the PVT line is within a feedback path of the locked loop.

3. The timing circuit as claimed in claim 1, wherein the reference signal passes through the PVT line before being received by the locked loop.

4. The timing circuit as claimed in claim 1, wherein the PVT line is within a tracking loop that tracks PVT drift of the PVT line.

5. The timing circuit as claimed in claim 1, wherein the PVT line is coupled to the output of the locked loop.

6. The timing circuit as recited in claim 1, wherein the PVT line is adjustable.

7. The timing circuit as recited in claim 6, wherein the PVT line is adjustable according to a digital code.

8. The timing circuit as claimed in claim 1, wherein the PVT line comprises a first adjustable PVT line and a second adjustable PVT line.

9. The timing circuit as claimed in claim 8, wherein the first and second adjustable PVT lines are adjustable according to a digital code.

10. The timing circuit as claimed in claim 1, wherein the PVT line comprises a plurality of inverters.

11. A clock recovery circuit for generating a recovered clock signal having a predetermined relationship with an incoming signal, comprising:
    means for generating the recovered clock signal, comparing the phase of the incoming signal to the phase of the recovered clock signal, and adjusting the phase of the recovered clock signal based on such comparison; and
    PVT (Process-Voltage-Temperature) drift means operatively associated with the means for generating so that PVT drift in the PVT drift means counters PVT drift in the means for generating.

12. The clock recovery circuit as claimed in claim 11, wherein the PVT drift means is within a feedback path of means for generating.

13. The clock recovery circuit as claimed in claim 11, wherein the incoming signal passes through the PVT drift means before being received by the means for generating.

14. The clock recovery circuit as claimed in claim 11, wherein the PVT drift means is within a tracking loop that tracks PVT drift of the PVT drift means.

15. The clock recovery circuit as claimed in claim 11, wherein the PVT drift means is coupled to an output of the means for generating.

16. The clock recovery circuit as recited in claim 11, wherein the PVT drift means is adjustable.

17. The clock recovery circuit as recited in claim 16, wherein the PVT drift means is adjustable according to a digital code.

18. The clock recovery circuit as claimed in claim 11, wherein the PVT drift means comprises a first adjustable PVT line and a second adjustable PVT line.

19. The clock recovery circuit as claimed in claim 18, wherein the first and second adjustable PVT lines are adjustable according to a digital code.

20. The clock recovery circuit as claimed in claim 11, wherein the PVT drift means comprises a plurality of inverters.

21. An information-bearing medium having computer-readable information thereon, the computer-readable information being configured to actuate a circuit-forming apparatus to form a cell of an integrated circuit including a clock recovery circuit, the clock recovery circuit being operable to generate a recovered clock signal having a predetermined relationship with an incoming signal, the clock recovery circuit comprising:
    at least one locked loop for generating the recovered clock signal, comparing the phase of the incoming signal to the phase of the recovered clock signal, and adjusting the phase of the recovered clock signal based on such comparison; and
    at least one PVT (Process-Voltage-Temperature) line operatively associated with the locked loop so that PVT drift in the PVT line counters PVT drift in the locked loop.

22. The clock recovery circuit as claimed in claim 21, wherein the PVT line is within a feedback path of the locked loop.

23. The clock recovery circuit as claimed in claim 21, wherein the incoming signal passes through the PVT line before being received by the locked loop.

24. The clock recovery circuit as claimed in claim 21, wherein the PVT line is within a tracking loop that tracks PVT drift of the PVT line.

25. The clock recovery circuit as claimed in claim 21, wherein the PVT line is coupled to the output of the locked loop.

26. The clock recovery circuit as recited in claim 21, wherein the PVT line is adjustable.

27. The clock recovery circuit as recited in claim 26, wherein the PVT line is adjustable according to a digital code.

28. The clock recovery circuit as claimed in claim 21, wherein the at least one PVT line comprises a first adjustable PVT line and a second adjustable PVT line.

29. The clock recovery circuit as claimed in claim 28, wherein the first and second adjustable PVT lines are adjustable according to a digital code.

30. The clock recovery circuit as claimed in claim 21, wherein the PVT line comprises a plurality of inverters.

31. A method of generating a recovered clock signal having a predetermined relationship with an incoming signal, the method comprising the steps of:
    generating the recovered clock signal;
    comparing the phase of the incoming signal to the phase of the recovered clock signal using a comparison circuit;
    adjusting the phase of the recovered clock signal based on the comparing; and
    compensating for PVT (process-voltage-temperature drift associated with the comparison circuit through use of a a PVT drift line.

* * * * *

UNITED STATES PATENT AND TRADEMARK OFFICE
CERTIFICATE OF CORRECTION

PATENT NO. : 7,519,844 B2
APPLICATION NO. : 11/158753
DATED : April 14, 2009
INVENTOR(S) : Jade M. Kizer and Sivakumar Doriswamy It is certified that error appears in the above-identified patent and that said Letters Patent is hereby corrected as shown below:

Column 10, line 63, "(process-voltage-temperature" should read --(Process-Voltage-Temperature)--.

Signed and Sealed this

First Day of June, 2010

David J. Kappos
*Director of the United States Patent and Trademark Office*